(12) United States Patent
Miyata et al.

(10) Patent No.: US 6,434,491 B1
(45) Date of Patent: Aug. 13, 2002

(54) METHOD OF ANALYZING ELECTROMAGNETIC FIELDS IN ROTARY MACHINE AND ELECTROMAGNETIC FIELD ANALYZER

(75) Inventors: Kenji Miyata; Hideshi Fukumoto, both of Hitachinaka; Akiyoshi Komura; Kohji Maki, both of Hitachi, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/463,783

(22) PCT Filed: Oct. 26, 1998

(86) PCT No.: PCT/JP98/04835

§ 371 (c)(1),
(2), (4) Date: Jan. 28, 2000

(87) PCT Pub. No.: WO00/25145

PCT Pub. Date: May 4, 2000

(51) Int. Cl.⁷ ............................. G01B 5/28; G01B 5/30; G06F 19/00
(52) U.S. Cl. ........................................ 702/38; 324/260
(58) Field of Search ............................... 702/33, 38, 64, 702/65, 57, 115, 145, 182, 183, 189, 66, 70, 71, 125, 126; 324/772, 545, 546, 260, 200; 318/521

(56) References Cited

U.S. PATENT DOCUMENTS

| | | | | |
|---|---|---|---|---|
| 5,315,233 A | * | 5/1994 | Sakiyama et al. | 324/74 |
| 5,404,108 A | * | 4/1995 | Storar | 324/546 |
| 5,621,649 A | * | 4/1997 | Iwata et al. | 702/64 |
| 5,907,244 A | * | 5/1999 | Crabill et al. | 324/546 |
| 6,051,987 A | * | 4/2000 | Stokes | 324/772 |
| 6,226,599 B1 | * | 5/2001 | Namiki | 702/57 |
| 6,288,471 B1 | * | 9/2001 | Komentani | 310/254 |

* cited by examiner

*Primary Examiner*—John S. Hilten
*Assistant Examiner*—Demetrius Pretlow
(74) *Attorney, Agent, or Firm*—Antonelli, Terry, Stout & Kraus, LLP

(57) ABSTRACT

A method of analyzing electromagnetic fields created in a rotary machine and an analyzer. The method and analyzer provide for an electromagnetic field in a total analysis space of a rotary machine including a stator space containing a stator and a rotor space containing a rotor to be analyzed to determined a boundary field between the stator space and the rotor space. The boundary field in a direction of rotation in modes is expanded and the modes obtained by expansion are converted into rotating magnetic field components. using the rotating magnetic field components as boundary conditions for a boundary between the stator space and the rotor space, an electromagnetic field in the stator space is analyzed and an electromagnetic field in the rotor space is analyzed.

10 Claims, 6 Drawing Sheets

METHOD OF ANALYZING ELECTROMAGNETIC FIELDS IN ROTARY MACHINE AND ELECTROMAGNETIC FIELD ANALYZER

TECHNICAL FIELD

The present invention relates to a method of analyzing an electromagnetic field created in a rotary machine, such as a generator or a motor, and an electromagnetic field analyzer.

BACKGROUND INVENTION

A time step method carries out the sequential analysis of an electromagnetic field that induces an eddy current in a rotary machine by turning a rotor little by little. This known time step method is mentioned in H.C. Lai, D. Rodger and P.J. Leonard, "Coupling meshes in 3D problems involving movements", IEEE Transactions on Magnetics, Vol. 28, No. 2, pp. 1732–1734 (1992).

A technique disclosed in Japanese Patent Laid-open No. Hei 7-198810 divides the results of magnetic field analysis into a plurality of groups, subjects each group to a spatial harmonic analysis and time harmonic analysis, and separates the same into a positive-phase-sequence component and a negative-phase-sequence component.

SUMMARY OF INVENTION

The time step method where the rotor is turned stepwise for sequential analysis is effective as a transient analyzing method. However, when obtaining a steady state solution, a synchronous rotary machine requires a several turns for rotation analysis and an induction rotary machine requires several tens to several hundreds of turns for rotation analysis before the solution settles down in a steady state. The number of time steps in one turn nearly equals the number of elements arranged along the direction of rotation and is as large as a hundred. Therefore, several hundreds time steps are necessary for the analysis of the a synchronous machine, and several thousands to several tens of thousands of time steps are necessary for the analysis of an induction machine. Therefore, there was a problem that a very large computation time is consumed for obtaining a steady state solution.

Accordingly, it is an object of the present invention to provide a fast analyzing method for electromagnetic fields of rotary machines in a steady or quasi-steady state, and an electromagnetic field analyzer based on the method.

With the foregoing object in view, the present invention is characterized by analyzing an electromagnetic field in a total analysis space of a rotary machine consisting of two partial spaces, i.e., a stator space containing a stator and a rotor space containing a rotor to determine a boundary field between the stator space and the rotor space; expanding the boundary field into modes along a direction of rotation; converting the obtained modes into rotating magnetic field components; and analyzing electromagnetic fields individually in the stator space and the rotor space by using the obtained rotating magnetic field components as boundary conditions on the slip surface of the stator space and the rotor space.

According to the present invention, a steady-state solution or a quasi-steady-state solution of an electromagnetic field in a rotary machine can be acquired by several iterations of calculation. Since the boundary field between the stator space and the rotor space is updated successively taking the influence of an obtained eddy current into consideration, a self-consistent solution can be obtained for the total analysis space by executing the electromagnetic field analyzing method of the present invention several times.

The obtained modes may be converted into rotating magnetic field components after excluding periodically fluctuating components of a magnetic circuit system between the stator and rotor.

The obtained modes may be converted into complex rotating components of the magnetic field after excluding periodically fluctuating components of a magnetic circuit system between the stator and the rotor, and the complex rotating components as a boundary condition may be assigned on the boundary surface between the stator space and the rotor space in a stationary coordinate system for the stator space and in a rotatory coordinate system for the rotor space.

The total space analysis and the partial space analysis may be alternatively repeated where the eddy current obtained in the partial space analysis is regarded as a given current in the total space analysis.

The mode expansion can be applied in the edge finite element method by radially dividing an air gap between the rotor and the stator into three or more layers in a meshing process, and by dividing the air gap into elements so that the edges at the same axial position on the slip surface approximately coincide with each other by rotating around the rotation axis.

BEST MODE FOR CARRYING OUT THE INVENTION

First Embodiment

Figure 1:
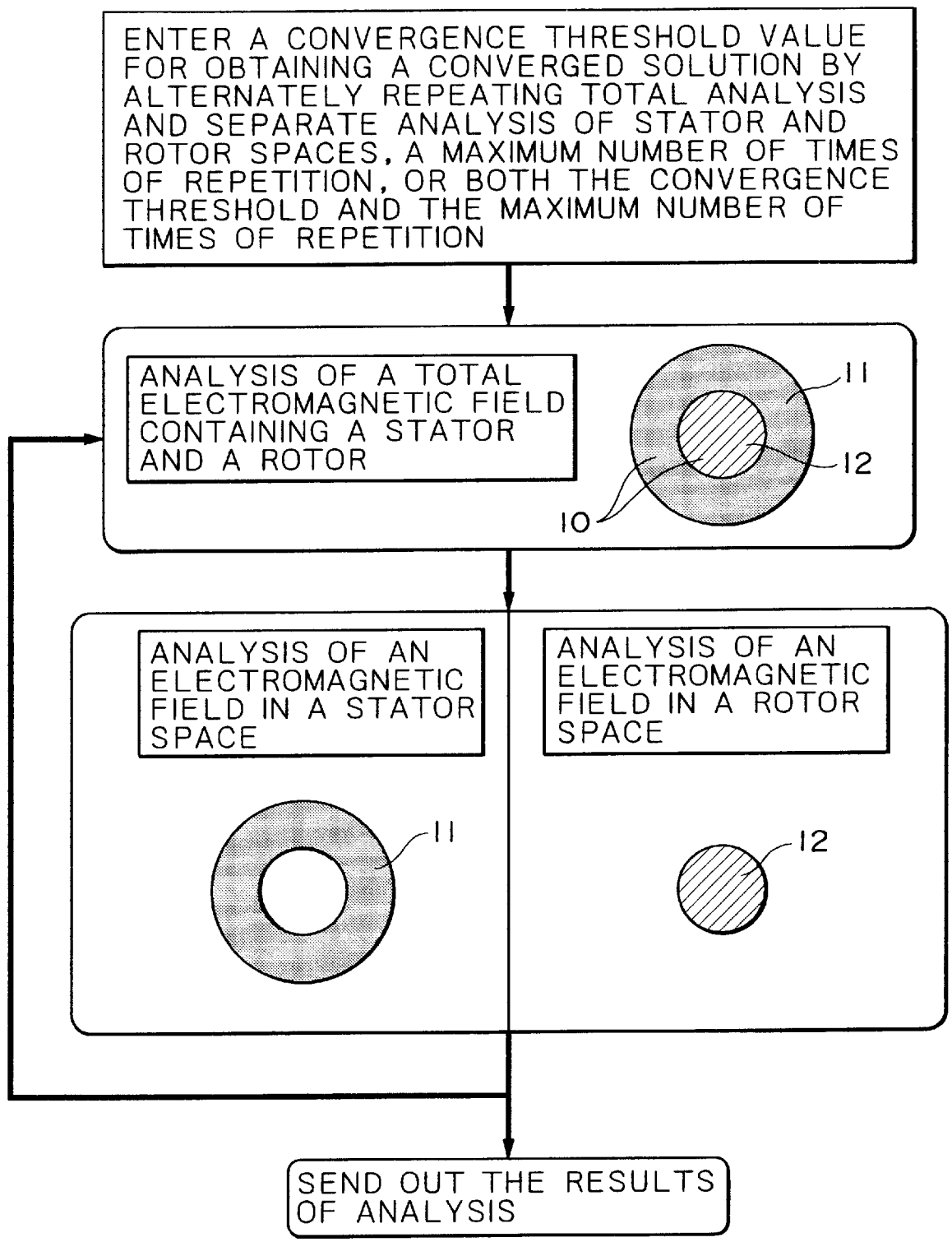
FIG. 1 is a flow diagram illustrating an electromagnetic field analyzing process representing a first embodiment according to the present invention.

An electromagnetic field analyzing process representing a first embodiment according to the present invention will be described with reference to FIG. 1.

First, a total space field is analyzed. An electromagnetic field in a total analysis space 10 consisting of a stator space 11 containing a stator and a rotor space 12 containing a rotor is analyzed to determine a boundary field between the stator space 11 and the rotor space 12. The obtained boundary field between the stator space 11 and the rotor space 12 is expanded in modes in the direction of rotation. After excluding periodically fluctuating components of a magnetic circuit system between the stator and the rotor, the obtained modes are converted into rotating components of magnetic fields, and the rotating components are modulated by the fluctuating components.

Subsequently, the stator space field and the rotor space field are analyzed separately. The total analysis space 10 is divided into the stator space 11 and the rotor space 12. The modulated rotating magnetic field components provided by the electromagnetic field analysis of the total analysis space 10 are assigned as a boundary condition on the boundary surface between the stator space 11 and the rotor space 12, and the stator space 11 and the rotor space 12 are subjected individually to electromagnetic field analysis. An electromagnetic field inducing an eddy current can be obtained by the electromagnetic field analysis.

Regarding the obtained eddy current as a given current, the total space field may be analyzed again. Thus, the total space field and the partial fields may be repeatedly analyzed a plurality of times. The number of times of repetition of the electromagnetic field analyzing processes is limited by a predetermined convergence criterion for solution and the maximum number of repeating operations.

This embodiment enables the direct determination of a steady-state solution and the quasi-steady-state solution of an electromagnetic field in a rotary machine by several cycles of calculation. The boundary field between the stator space 11 and the rotor space 12 is updated one after another, taking into consideration the effect of the eddy current by carrying out the electromagnetic field analyzing processes in this embodiment a plurality of times. Therefore, a self-consistent solution can be obtained for the total analysis space.

Second Embodiment

An electromagnetic field analyzing method representing a second embodiment according to the present invention will be described with reference to FIGS. 2 and 3.

Figure 2:
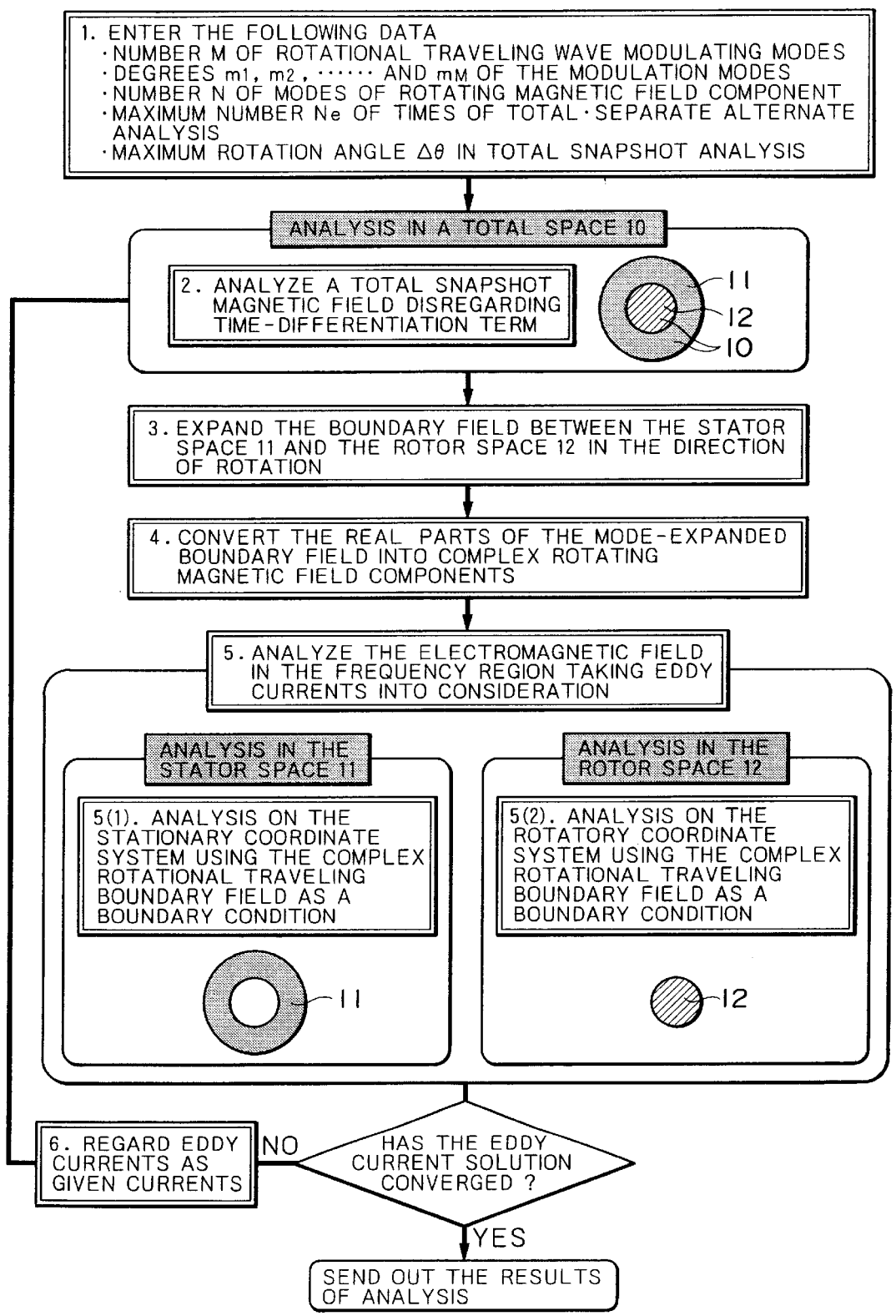
FIG. 2 is a diagram illustrating an electromagnetic field analyzing process in a second embodiment according to the present invention.
Figure 3:
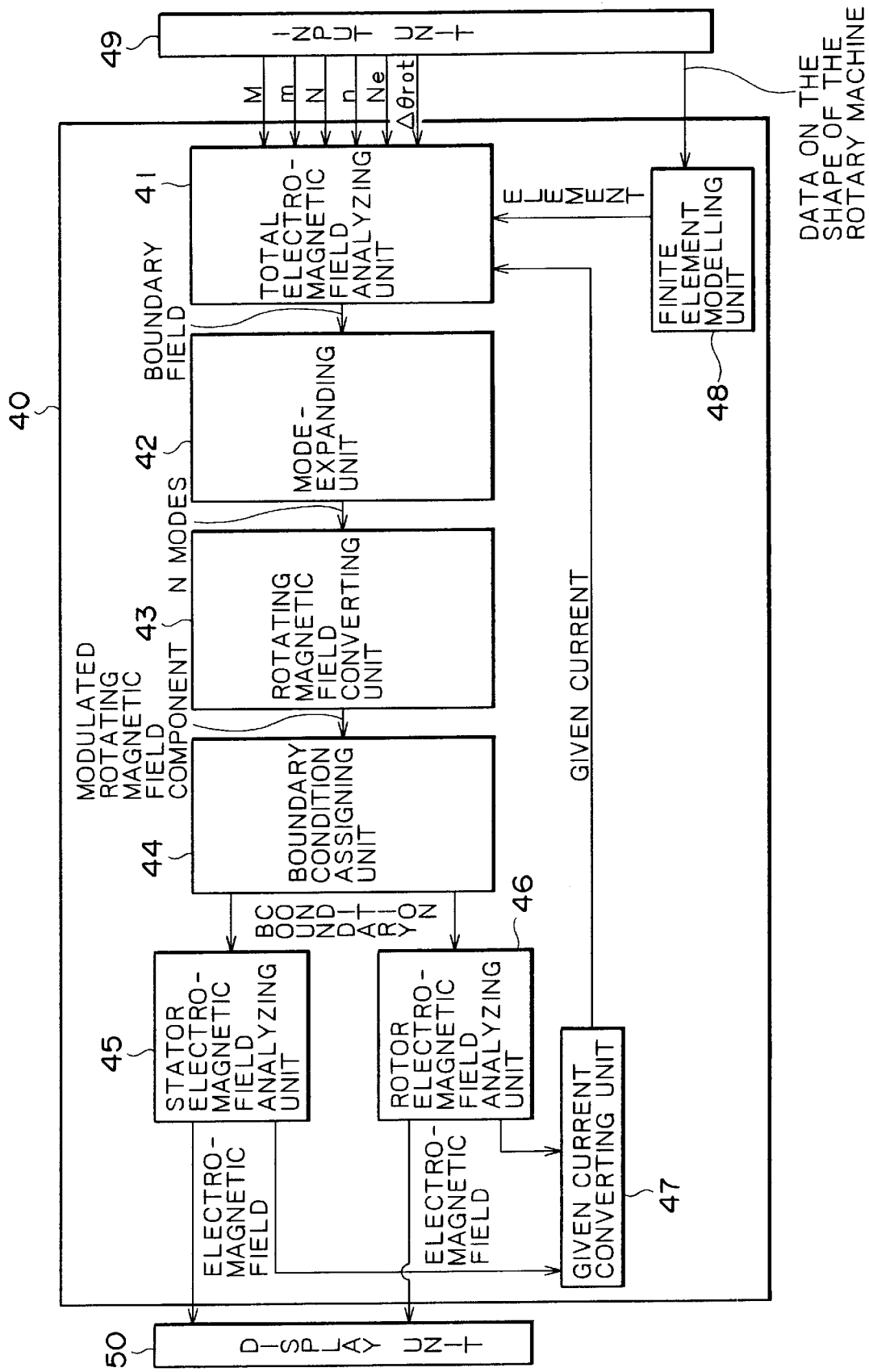
FIG. 3 is a block diagram of an electromagnetic field analyzing apparatus for the second embodiment according to the present invention.

FIG. 2 is a flow chart of the electromagnetic field analyzing method of the second embodiment and FIG. 3 is a block diagram of an electromagnetic field analyzer 40 for carrying out the electromagnetic field analyzing method of the second embodiment.

Input data including M: the number of rotational traveling wave modulation modes, $m_1$, $m_2$, . . . and $m_M$; N: the orders of the modulation modes; the number of modes of rotating magnetic field components, $n_1$, $n_2$, . . . and $n_N$; Nc the orders of the modes; the maximum iteration, number the alternate analysis of the total space field and the partial space fields, and a maximum rotation angle $\Delta\theta_{rot}$ in total snapshot analysis are entered into the electromagnetic field analyzer 40 by operating an input unit 49. Data on the shape of the rotary machine is entered into a finite element modelling unit 48 by operating the input unit 49.

The finite element modelling unit 48 divides the total analysis space 10 consisting of the stator space 11 containing the stator and the rotor space 12 containing the rotor into a plurality of elements on the basis of the data on the shape of the rotary machine. A total electromagnetic field analyzing unit 41 executes total electromagnetic field analysis (total snapshot analysis) by the finite element method supposing that the time differential term is naught.

A mode expanding unit 42 expands the boundary field between the stator space 11 and the rotor space 12, which is analyzed by the total electromagnetic field analyzing unit 41, into modes (Fourier expansion) for one round in the direction of rotation.

Since coils are wound on the stator and the rotor in a periodic arrangement along the direction of rotation, mode components including a series of harmonic components. corresponding to the periodic construction are mixed. The mode includes a periodic fluctuating component of the magnetic circuit system between the stator and the rotor and modulates the rotating magnetic field component. M modes are taken into consideration for analysis. The fluctuating component can be extracted from the M+1 times of total space snapshot analyses in which the rotor is rotated in a step of $\Delta\theta_{rot}$ M.

A rotating magnetic field converting unit 43 removes the periodic fluctuating component of the magnetic circuit system between the stator and the rotor from the modes and converts N modes into complex rotating magnetic field components. The complex rotating magnetic field components are modulated by the M periodic fluctuating components of the magnetic circuit system to produce N modulated complex rotating magnetic field components.

In the stator space 11 as a stationary coordinate system, a boundary condition assigning unit 44 assigns the modulated complex rotating magnetic field components as boundary conditions on the boundary surface between the stator space 11 and the rotor space 12. In the rotor space 12, as a rotary coordinate system, the boundary condition assigning unit 44.assigns the modulated complex rotating magnetic field components as boundary conditions on the boundary surface between the stator space 11 and the rotor space 12.

A stator space electromagnetic field analyzing unit 45 and a rotor space electromagnetic field analyzing unit 46 solve the electromagnetic fields in the stator space 11 and the rotor space 12, respectively, for each mode under the boundary conditions in a complex frequency domain, taking time differentiation terms into consideration. When the magnetic permeability of a magnetic body is dependent on a magnetic field, the equation to be solved is a nonlinear equation and a plurality of modes are coupled. Therefore, each mode is solved self-consistently taking mode coupling into consideration.

Electromagnetic fields analyzed by the stator space electromagnetic field analyzing unit 45 and the rotor space electromagnetic field analyzing unit 46 are displayed on a display unit 50.

The electromagnetic fields are approximately obtained and the obtained eddy current affects the boundary field between the stator space 11 and the rotor space 12. To obtain a solution with higher accuracy, as eddy-current/given-current converting unit 47 converts all the real parts of the eddy currents of the modes into given currents, and sends the given currents to the total space electromagnetic field analyzing unit 41. The total electromagnetic field analyzing unit 41 analyzes the total space snapshot field again to update the boundary field between the stator space 11 and the rotor space 12. These operations are repeated until the solution converges. Repetition of those operations is limited by the maximum number Ne of repetitions of total/partial alternate analysis. Usually, the solution can be obtained by several repetitions of calculations.

Third Embodiment

An electromagnetic field analyzing method representing a third embodiment according to the present invention will be described. The electromagnetic field analyzing method in the third embodiment is different from that in the second embodiment with respect to the method of dividing the elements of an air gap 5.

Figure 4:
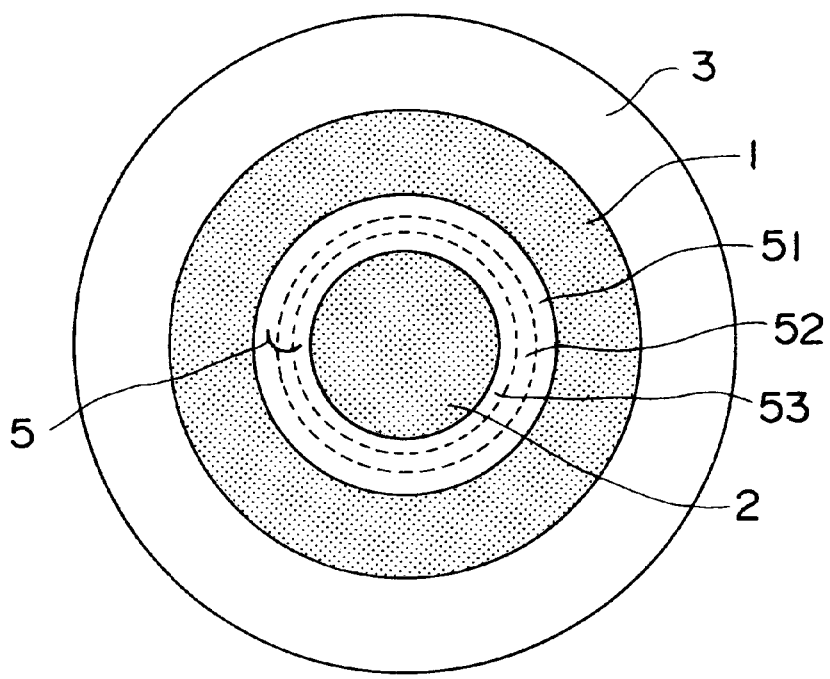
FIG. 4 is a cross-sectional view of a rotor 1, a stator 2 and an air region 3 around the stator 2 used for explaining an electromagnetic field analyzing method representing a third embodiment according to the present invention.

Referring to FIG. 4, finite element data to be used in a finite element analysis is prepared for a rotor 1, a stator 2 and an air space 3 around the rotor 1 and the stator 2. No element division data is prepared for an air gap 5 between the rotor 1 and the stator 2, and element division data is produced automatically by a computer.

Figure 5:
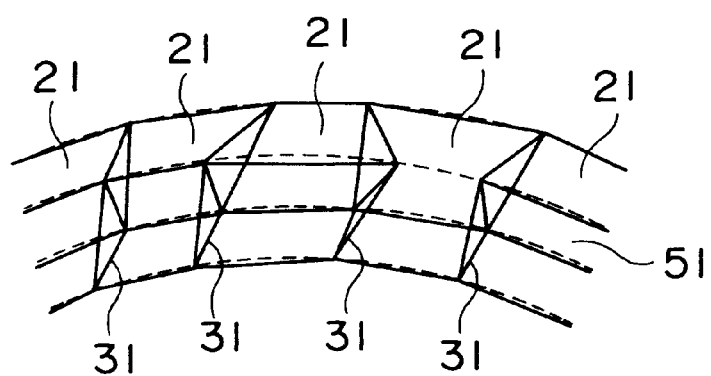
FIG. 5 is a diagram for use on explaining the finite element modelling of an air gap 51 in the third embodiment.
Figure 6:
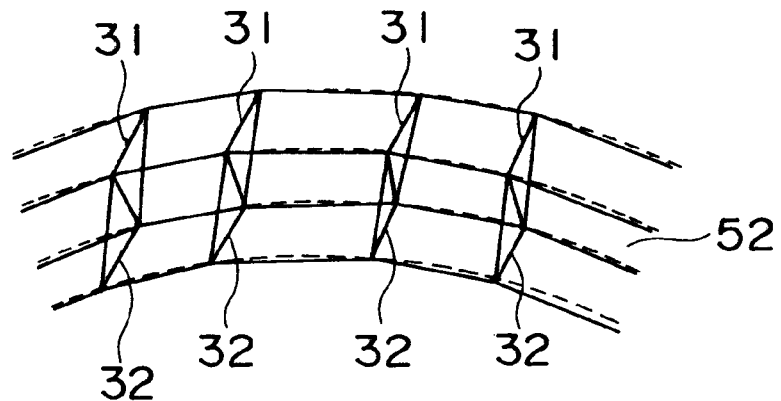
FIG. 6 is a diagram use in explaining the finite element modelling of an air gap 52 in the third embodiment.
Figure 7:
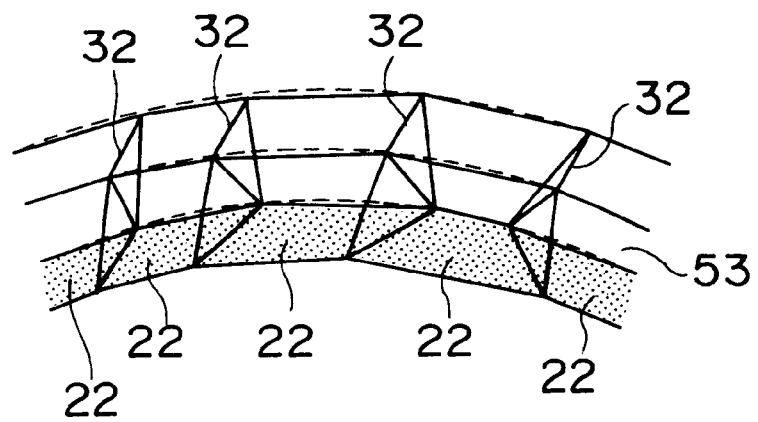
FIG. 7 is a diagraman for use in explaining the element division of an air gap 53 in the third embodiment.

A method of finite element meshing of the air gap 5 will be described. The air gap 5 is divided into, for example, three air gaps 51, 52 and 53. FIGS. 5 to 7 are element meshing diagrams of the air gaps 51, 52 and 53, respectively. As shown in FIGS. 5 to 7, a finite element mesh is made so that all edges 31 or 32 at two circumferential lines of rotation on the inner or outer surface of the air gap 52 coincide substantially if those edges are rotated in the direction of rotation around the axis. Thus, when the edge finite element method which is powerful for electromagnetic field analysis is used for analysis, mode expansion of unknowns arranged on the edges 31 and 32 in the direction of rotation is possible. The stator space 11 consists of the stator 1, the air space 3 and the air gap 51, and the rotor space 12 consists of the rotor 2 and the air gaps 52 and 53. The stator space 11 may consist of the stator 1, the air space 3 and the air gaps 51 and 52, and the rotor space 12 may consist of the rotor 2 and the air gap 53.

Figure 8:
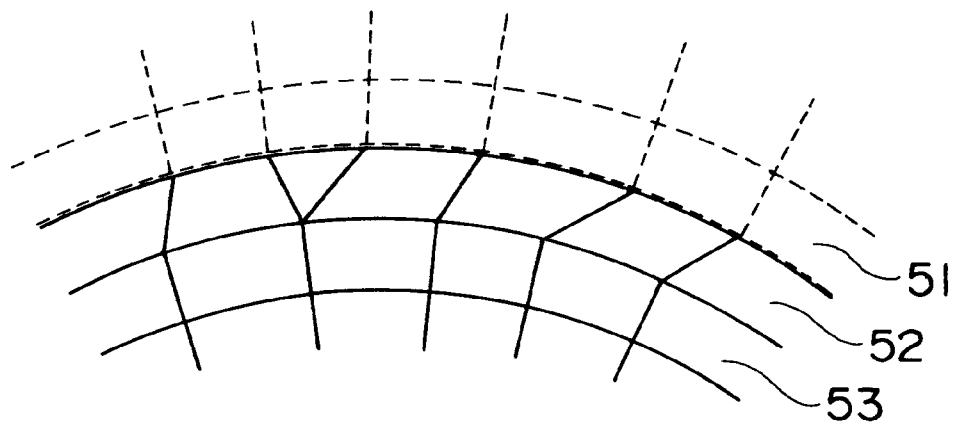
FIG. 8 is a diagram for use in explaining the element division of air gaps 51 to 53 in the third embodiment.

FIG. 8 illustrates a method of finite element meshing of the air gap 5 in a section perpendicular to the axis of rotation. As obvious from FIG. 8, the elements can properly be connected even if the stator 1 and the rotor 2 are divided along the direction of rotation in different numbers of divisions, respectively. The third embodiment does not need to divide the air gap 5 into elements beforehand, and the rotor 1 and the stator 2 can be optionally divided into finite elements, so that the edge finite element method can be applied.

Fourth Embodiment

An electromagnetic field analyzing method representing a fourth embodiment according to the present invention will be described. The electromagnetic field analyzing method of the fourth embodiment is different from those in the second and the third embodiments with respect to the method of finite element meshing of an air gap 5.

Figure 9:
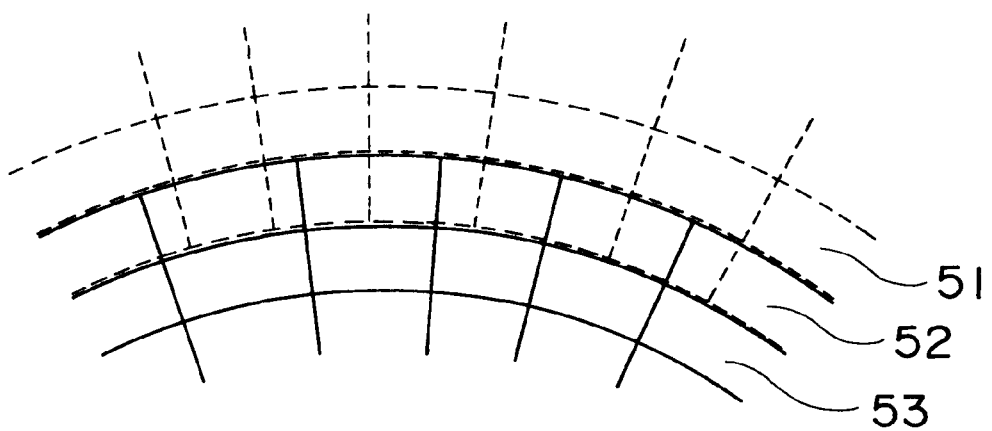
FIG. 9 is a diagram for use in explaining the element division of air gaps 51 to 53 in a fourth embodiment.

FIG. 9 illustrates a method of finite element modelling of the air gaps 51, 52 and 53. As obvious from FIG. 9, finite elements of the stator space 11 and the rotor space 12 partially overlap in the air gap 52.

In this embodiment, a stator space 11 consists of the stator 1, an air space 3 and the air gap 51, and a rotor space 12 consists of the rotor 2 and the air gaps 52 and 53. The stator space 11 may consist of the stator 1, the air space 3 and the air gaps 51 and 52, and the rotor space 12 may consist of the rotor 2 and the air gap 53.

Like the method of finite element modelling in the third embodiment, a finite element mesh is made so that all edges 31 or 32 at two circumferential lines in the direction of rotation on the inner or outer surface of the air gap 52 coincide substantially if those edges are rotated around the axis of rotation. In the air gap 52 in which some elements overlap, unknowns in the stator space 11 and the rotor space 12 can be easily interpolated to each other.

The fourth embodiment does not need finite element meshing of the air gap 5 beforehand. Needless to say, the edge finite element method is applicable and elements previously produced by automatic finite element meshing can be used when the rotor 2 is rotated to obtain the periodic fluctuating component of a magnetic circuit system between the stator and the rotor, which curtails the time necessary for analysis.

In the third and the fourth embodiments, the stator space 11 may consist of the stator 1, the air space 3 and the air gaps 51 and 52, and the rotor space 12 may consist of the rotor 2 and the air gaps 52 and 53. The stator space 11 may consist of the stator 1, the air space 3 and the air gap 51, and the rotor space 12 may consist of the rotor 2 and the air gap 53. Although the boundaries of the stator space 11 and the rotor space 12 do not coincide with each other in the latter case, it goes without saying that the separate analysis of the stator space 11 and the rotor space 12 can be achieved through mode expansion in the direction of rotation.

Although the foregoing embodiments have been described on the assumption that the rotor 2 is disposed on the inner side of the stator 1, it goes without saying that the present invention is applicable to rotary machines of any construction, such as a rotary machine having a rotor 2 disposed on the outer side of a stator 1 and a rotary machine having stators 1 disposed on the outer and the inner side, of a rotor 2, respectively.

As is apparent from the foregoing description, the electromagnetic field analyzing method and the electromagnetic field analyzer of the present invention are capable of accomplishing steady-state or quasi-steady-state electromagnetic analysis taking into consideration eddy currents induced in a rotary machine at a rate ten to a hundred times higher than that of the conventional time step method for synchronous machines and at a rate one thousand to ten thousands of times higher than that of the conventional time step method for induction machines. Thus, the present invention is effectively applicable to the analysis of electromagnetic fields in rotary machines including generators and motors.

What is claimed is:

1. A method of analyzing electromagnetic fields created in a rotary machine, said method comprising the steps of:

analyzing an electromagnetic field in a total analysis space of a rotary machine including a stator space containing a stator and a rotor space containing a rotor to determine a boundary field between the stator space and the rotor space;

expanding the boundary field in a direction of rotation in modes;

converting the modes obtained by expansion into rotating magnetic field components;

using the rotating magnetic field components as boundary conditions for a boundary between the stator space and the rotor space;

analyzing an electromagnetic field in the stator space; and analyzing an electromagnetic field in the rotor space.

2. A method of analyzing electromagnetic fields created in a rotary machine, said method comprising the steps of:

analyzing electromagnetic fields in a total analysis space of a rotary machine including a stator space containing a stator and a rotor space containing a rotor to determine a boundary field between the stator space and the rotor space;

expanding the boundary field in a direction of rotation in modes;

converting the modes into rotating magnetic field components, where a periodic fluctuating component of a magnetic circuit system between the stator and the rotor is excluded from the modes obtained by expansion;

modulating the rotating magnetic field components by the fluctuating component to obtain modulated rotating magnetic field components;

using the modulated rotating magnetic field components as boundary conditions for a boundary surface between the stator space and the rotor space;

analyzing an electromagnetic field in the stator space; and analyzing an electromagnetic field in the rotor space.

3. A method of analyzing an electromagnetic field created in a rotary machine, said method comprising the steps of:

analyzing an electromagnetic field in a total analysis space of a rotary machine including a stator space containing a stator and a rotor space containing a rotor to determine a boundary field between the stator space and the rotor space;

expanding the boundary field in a direction of rotation in modes;

converting the modes, into complex rotating magnetic field components where a periodic fluctuating component of a magnetic circuit system between the stator and the rotor is excluded from the modes obtained by expansion;

modulating the complex rotating magnetic field components by the fluctuating component to obtain modulated complex rotating magnetic field components;

using the modulated complex rotating magnetic field components as boundary conditions and assigning the modulated complex rotating magnetic field components on a boundary surface between the stator space and the rotor space in the stator space as a stationary coordinate system;

using the modulated complex rotating magnetic field components as boundary conditions and assigning the modulated complex rotating magnetic field components on a boundary surface between the stator space and the rotor space in the rotor space as a rotary coordinate system;

analyzing an electromagnetic field in the stator space; and analyzing an electromagnetic field in the rotor space.

4. The method of analyzing an electromagnetic field according to any one of claims 1 to 3 further comprising the step of regarding an eddy current obtained in the partial space analysis as a given current on the basis of an electromagnetic field in the stator space and an electromagnetic field in the rotor space.

5. The method of analyzing an electromagnetic field according to any one of claims 1 to 3 further comprising the steps of:

radially dividing an air gap between the rotor and the stator into three or more layers for finite element modelling; and finite element modelling where all edges at two circumferential lines of rotation on an inner or outer surface of one of the layers in the divided air gap coincide substantially when these edges are rotated around the axis of rotation.

6. An electromagnetic field analyzer for analyzing electromagnetic fields in a rotary machine, said electromagnetic field analyzer comprising:

a total magnetic field analyzing unit that analyzes an electromagnetic field in a total analysis space of the rotary machine consisting of a stator space containing a stator and a rotor space containing a rotor and determines a boundary field between the stationary space and the rotary space;

a mode-expanding unit that expands the boundary field determined by the total magnetic field analyzing unit into modes in a direction of rotation;

a rotating magnetic field converting unit that converts the modes provided by the mode-expanding unit into rotating magnetic field components;

a boundary condition assigning unit that uses the rotating magnetic field components provided by the rotating magnetic field converting unit as boundary conditions on a boundary surface between the stator space and the rotor space;

a stator electromagnetic field analyzing unit that analyzes an electromagnetic field in the stator space on the basis of the boundary conditions assigned by the boundary condition assigning unit; and a rotor electromagnetic field analyzing unit that analyzes an electromagnetic field in the rotor space on the basis of the boundary conditions assigned by the boundary condition assigning unit.

7. The electromagnetic field analyzer according to claim 6, wherein the rotating magnetic field converting unit converts the modes into revolving magnetic field components, where a periodic fluctuating component of a magnetic circuit system between the stator and the rotor is excluded from the modes provided by the mode-expanding unit, and the rotating magnetic field converting unit modulates the rotating magnetic field components provided by the rotating magnetic field converting unit by the fluctuating component to determine modulated rotating magnetic field components.

8. The electromagnetic field analyzer according to claim 6, wherein the boundary condition assigning unit assigns the modulated complex rotating magnetic field components as boundary conditions on a boundary between the stator space and the rotor space in the stator space as a stationary coordinate system and in the rotor space as a rotary coordinate system.

9. The electromagnetic field analyzer according to claim 6 further comprising a given current converting unit that regards eddy current as a given current, which is obtained by the stator electromagnetic field analyzing unit and the rotor electromagnetic field analyzing unit, and that sends the given currents to the total electromagnetic field analyzing unit.

10. The electromagnetic field analyzer according to claim 6 further comprising a finite element modelling means that divides an air gap between the stator and the rotor radially into three or more layers for element division so that all of the edges at two circumferential lines of rotation on inner or outer surfaces of one of the layers in the divided air gap coincide substantially when those edges are rotated around the axis of rotation.

* * * * *